(12) United States Patent
Miura et al.

(10) Patent No.: US 9,847,271 B2
(45) Date of Patent: Dec. 19, 2017

(54) SEMICONDUCTOR DEVICE

(71) Applicant: FUJITSU LIMITED, Kawasaki-shi, Kanagawa (JP)

(72) Inventors: Yohei Miura, Kawasaki (JP); Yasushi Masuda, Kawasaki (JP); Satoshi Ohsawa, Kawasaki (JP); Yoshihiro Morita, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/336,199

(22) Filed: Oct. 27, 2016

(65) Prior Publication Data

US 2017/0148703 A1    May 25, 2017

(30) Foreign Application Priority Data

Nov. 20, 2015 (JP) ................. 2015-227733

(51) Int. Cl.
*H01L 23/10* (2006.01)
*H01L 23/34* (2006.01)
*H01L 23/367* (2006.01)
*H01L 23/31* (2006.01)
*H01L 31/024* (2014.01)
*G02B 6/42* (2006.01)

(52) U.S. Cl.
CPC ........... *H01L 23/3675* (2013.01); *G02B 6/42* (2013.01); *H01L 23/3128* (2013.01); *H01L 23/3677* (2013.01); *H01L 31/024* (2013.01)

(58) Field of Classification Search
CPC ........... H01L 23/3128; H01L 23/49816; H01L 23/3675; H01L 23/49811; H01L 23/3114; H01L 23/345; H01L 23/5386
USPC .......................................... 257/706
See application file for complete search history.

(56) References Cited

U.S. PATENT DOCUMENTS

2004/0218372 A1* 11/2004 Hamasaki ............... G02B 6/43
                                                    361/767
2011/0007762 A1    1/2011 Fukuda et al.

FOREIGN PATENT DOCUMENTS

JP      2003-043311      2/2003
WO      2009/113180      9/2009

* cited by examiner

*Primary Examiner* — Theresa T Doan
(74) *Attorney, Agent, or Firm* — Fujitsu Patent Center

(57) ABSTRACT

A semiconductor device includes: a processor having a heat sink mounted thereon; and an optical module having a heat transfer interposer, wherein the heat sink and the optical module are coupled to each other via the heat transfer interposer.

And a semiconductor device includes: a semiconductor chip mounted on a substrate; a lead that covers the semiconductor chip; a heat sink installed on the lead; and an optical module coupled to the heat sink via a heat transfer interposer.

8 Claims, 15 Drawing Sheets

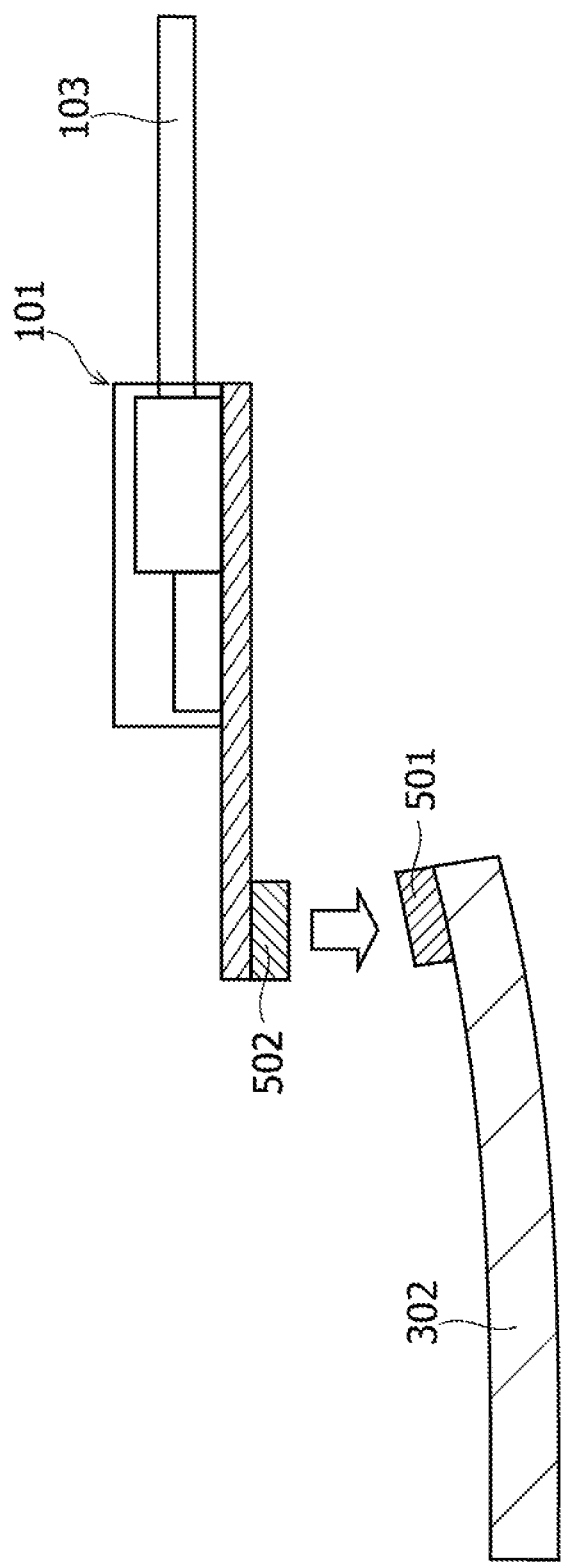

SEMICONDUCTOR DEVICE

CROSS-REFERENCE TO RELATED APPLICATION

This application is based upon and claims the benefit of priority of the prior Japanese Patent Application No. 2015-227733, filed on Nov. 20, 2015, the entire contents of which are incorporated herein by reference.

FIELD

The embodiments discussed herein are related to a semiconductor device.

BACKGROUND

With the high-speed operations of high-end servers and super computers, a method of transmitting optical signals in a substrate tends to be used instead of a method of transmitting electrical signals in a substrate. A photoelectric conversion module (optical module) performs a conversion from an optical signal into an electrical signal or a conversion from an electrical signal into an optical signal.

As illustrated in FIG. 11, an optical module 101 is disposed around a semiconductor device 300 such as, for example, a central processing unit (CPU) chip mounted on a main board 201, via an interposer 102. An optical fiber 103 is connected to the optical module 101.

A semiconductor chip 301 which is included in the semiconductor device 300 is mounted on a package substrate 302. The package substrate 302 is mounted on the main board 201 via ball grid array (BGA) balls 303. A heat sink 305 is mounted on the semiconductor chip 301 via a lead 304. A transmission path from the semiconductor chip 301 to the optical module 101 follows the sequence of the semiconductor chip 301, the package substrate 302, the BGA balls 303, the main board 201, the interposer 102, and the optical module 101.

In order to reduce a latency and transmission loss, the length of the electrical transmission path may be reduced by mounting the optical module 101 at a position near the semiconductor chip 301, and reducing the number of electrical contacts. Although the trend is oriented toward a method of directly receiving and transmitting optical signals from the inside of a CPU package (e.g., a multi-chip module (MCM) or silicon photonics), many technical problems remain for practical application thereof.

As illustrated in FIG. 12, there is a case where the optical module 101 is mounted on the package substrate 302. A transmission path from the semiconductor chip 301 to the optical module 101 follows the sequence of the semiconductor chip 301, the package substrate 302, the interposer 102, and the optical module 101.

The cooling of the optical module 101 is performed because the optical module 101 generates heat during the driving thereof. In order to cool the optical module 101, a cooling mechanism is separately mounted on the optical module 101. When the mounting position of the optical module 101 is close to the semiconductor chip 301, the cooling mechanism mounted on the optical module 101 and the heat sink 305 mounted on the semiconductor chip 301 may physically interfere with each other.

The followings are reference documents.
[Document 1] International Publication Pamphlet No. WO 2009/113180 and

[Document 2] Japanese Laid-Open Patent Publication No. 2003-043311.

SUMMARY

According to an aspect of the invention, a semiconductor device includes: a processor having a heat sink mounted thereon; and an optical module having a heat transfer interposer, wherein the heat sink and the optical module are coupled to each other via the heat transfer interposer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 15 is a sectional view illustrating an optical module and a package substrate related to a comparative example.

DESCRIPTION OF EMBODIMENTS

Hereinafter, an exemplary embodiment will be described with reference to the accompanying drawings. The configuration of the exemplary embodiment is given by way of example, and the present disclosure is not limited to the configuration of the exemplary embodiment.

Comparative Example

Figure 12:
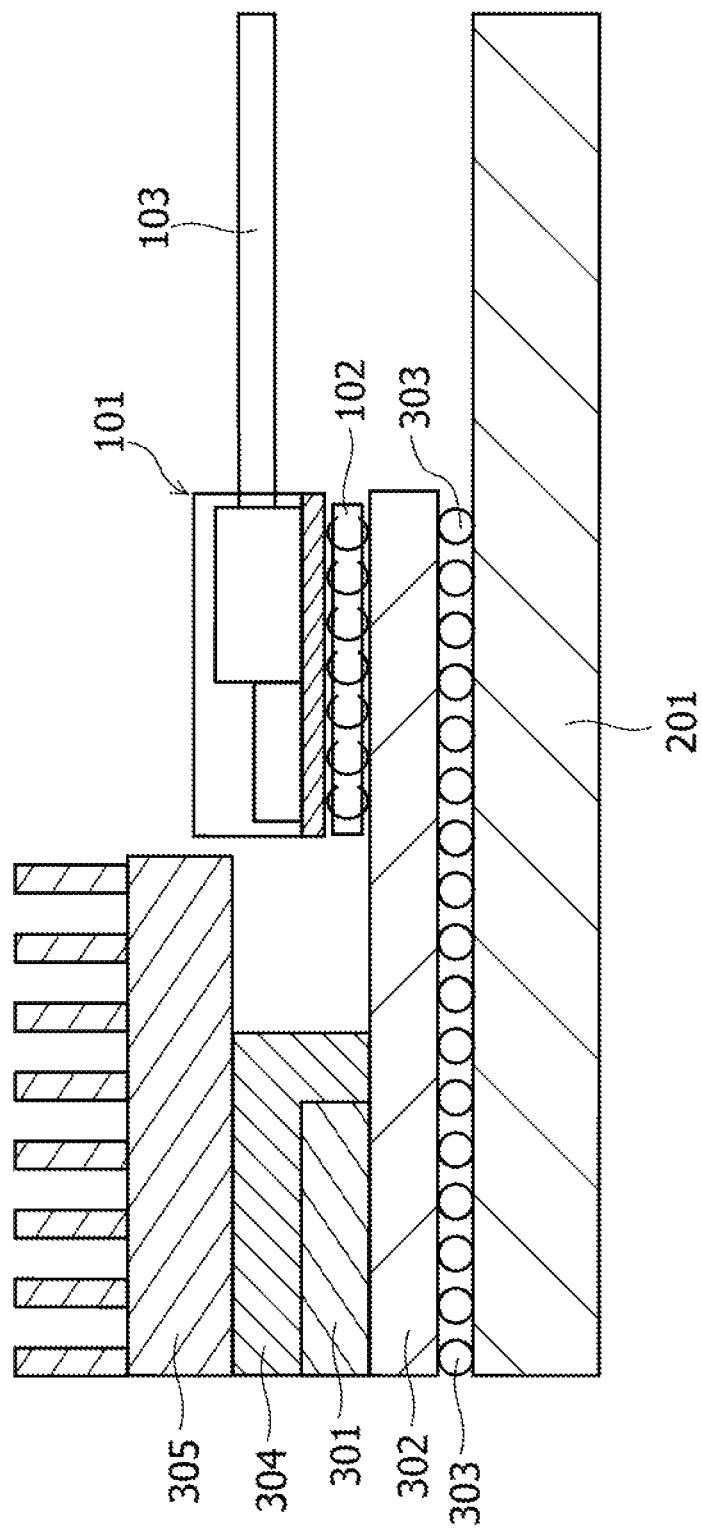
FIG. 12 is a sectional view illustrating a main board related to a comparative example.

Comparative examples will be described with reference to FIGS. 12 to 15. Because a failure may occur in the optical module 101 due to, for example, the effect of heat, the connection of the optical module 101 and the package substrate 302 may be performed via, for example, a separable interposer or connector such that the repair of the optical module 101 is enabled. However, as illustrated in FIG. 12, when the optical module 101 is mounted on the package substrate 302, the area of the package substrate 302 is enlarged. For example, when the optical module 101 having a size of 20 mm in length and width is mounted on the package substrate 302, the area of the package substrate 302 is enlarged by about 400 mm².

Local stress is generated on the package substrate 302 when the optical module 101 is mounted on the package substrate 302 via screwing in order to secure contact pressure for a terminal included in the interposer. When the local stress is generated on the package substrate 302, the package substrate 302 is tilted, and stress is generated on the BGA balls 303, which connect the main board 201 and the package substrate 302 to each other. Accordingly, the BGA balls 303 may be released or damaged.

In order to suppress the BGA balls 303 from being released, there is a structure in which the optical module 101 is placed on the main board 201, and the connection of the optical module 101 and the package substrate 302 is performed through a card edge connector method or a stack connector method.

Figure 13:
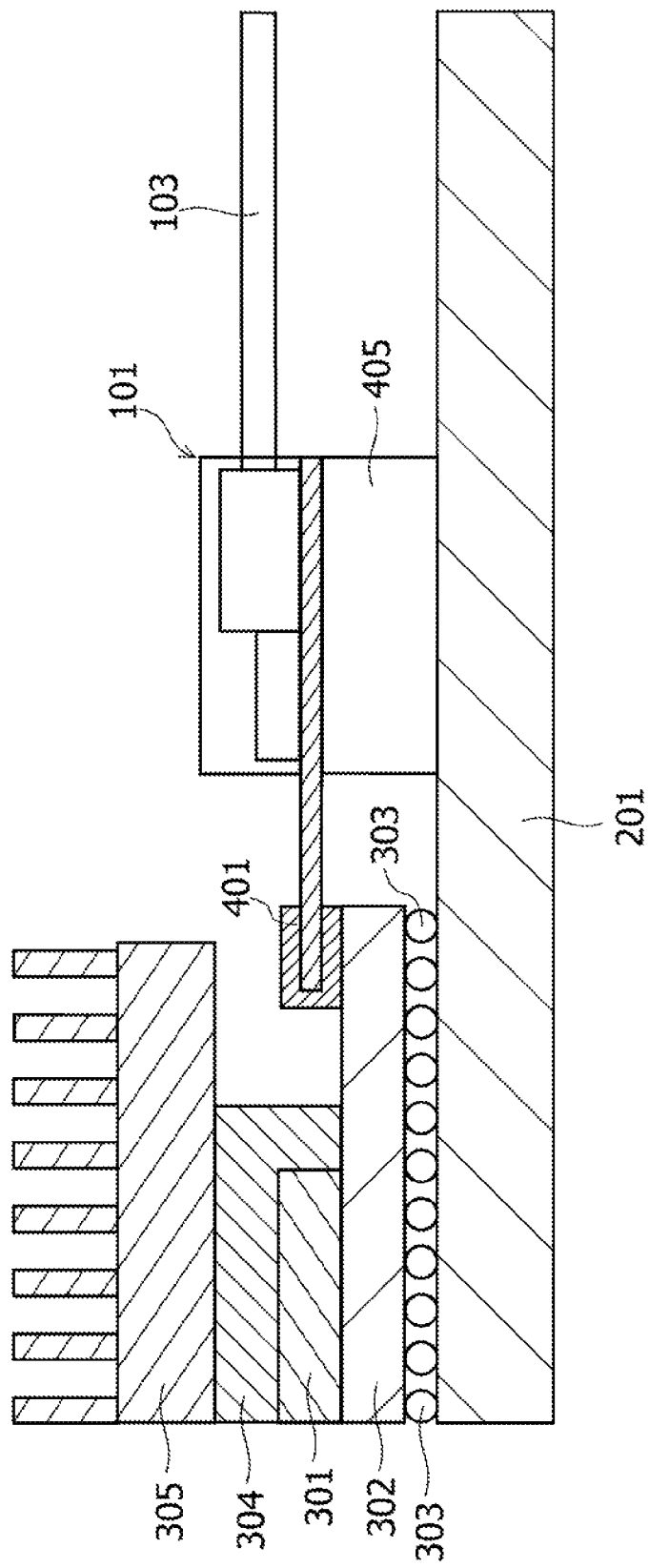
FIG. 13 is a sectional view illustrating a main board related to a comparative example.

FIG. 13 is a sectional view of the main board 201 using the card edge connector method. As illustrated in FIG. 13, in the card edge connector method, a connector 401 is mounted on the package substrate 302, and the optical module 101 and the connector 401 are fitted to each other in a direction parallel to the package substrate 302.

Figure 14:
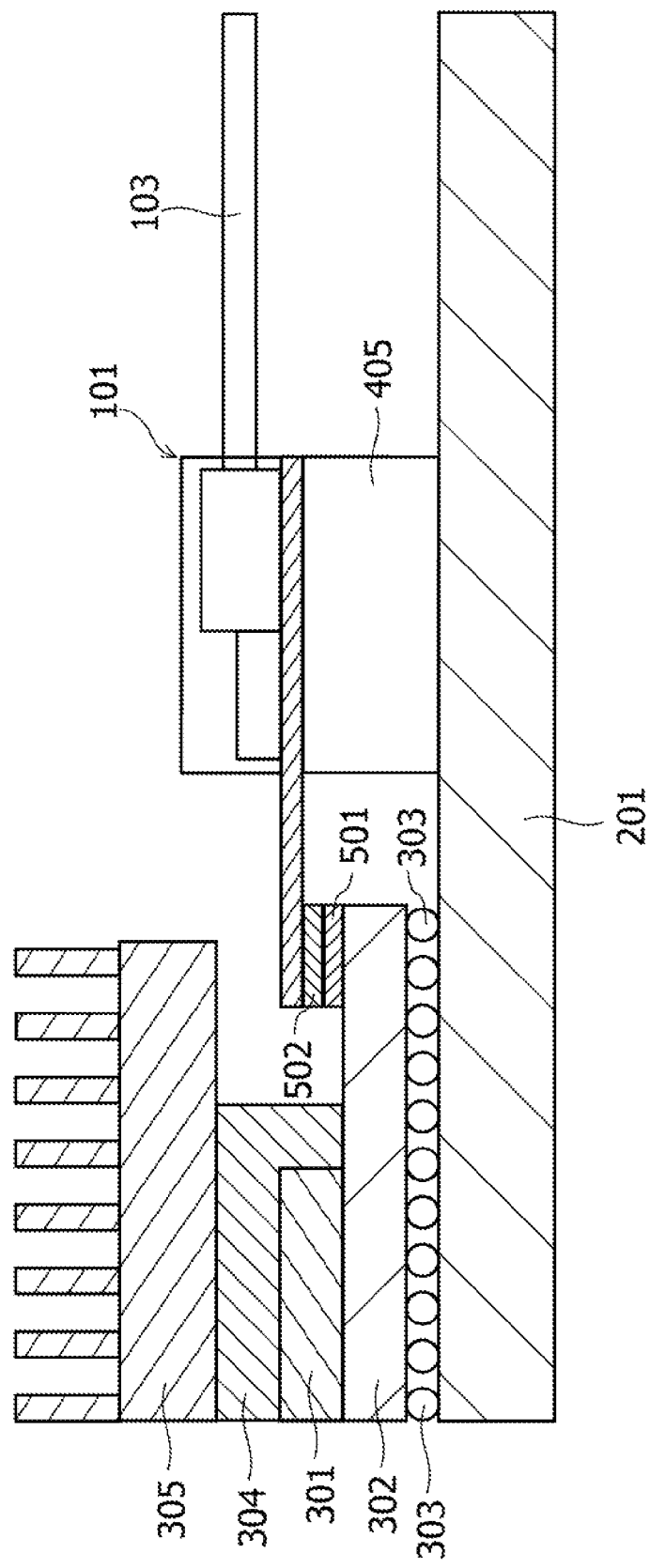
FIG. 14 is a sectional view illustrating a main board related to a comparative example.

FIG. 14 is a sectional view of the main board 201 using the stack connector method. As illustrated in FIG. 14, in the stack connector method, a connector 501 is mounted on the package substrate 302, a connector 502 is mounted on the optical module 101, and the connector 501 and the connector 502 are fitted to each other in a direction perpendicular to the package substrate 302.

As illustrated in FIGS. 13 and 14, when the connection of the optical module 101 and the package substrate 302 is performed through the card edge connector method or the stack connector method, the transmission and reception of signals between the optical module 101 and the main board 201 are not performed. However, in order to support the weight of the optical module 101, a support member 405 for supporting the optical module 101 is disposed on the main board 301. Accordingly, a space is secured for placing the support member 405 on the main board 201, which makes the mounting structure inefficient.

When the package substrate 302 is mounted on the main board 201 using the BGA balls 303, bending occurs in the package substrate 302 due to heat during mounting as illustrated in FIG. 15. The bending of the package substrate 302 is increased from the central portion toward the outer circumferential portion of the package substrate 302. In a next-generation super computer or the like, maximum bending of about 0.15 mm occurs in the package substrate 302, and there is a possibility of having a bad effect on the stability of electrical contact of the optical module 101 and the package substrate 302. The length from the top surface of the package substrate 302 to the bottom surface of the heat sink 305 is about 4 mm. Because the effective fitting length of a small connector, which is accommodated within the range of about 4 mm, is short, the bending of about 0.15 mm in the package substrate 302 has a considerable effect on the fitting performance and the stability in electrical contact.

Figure 1:
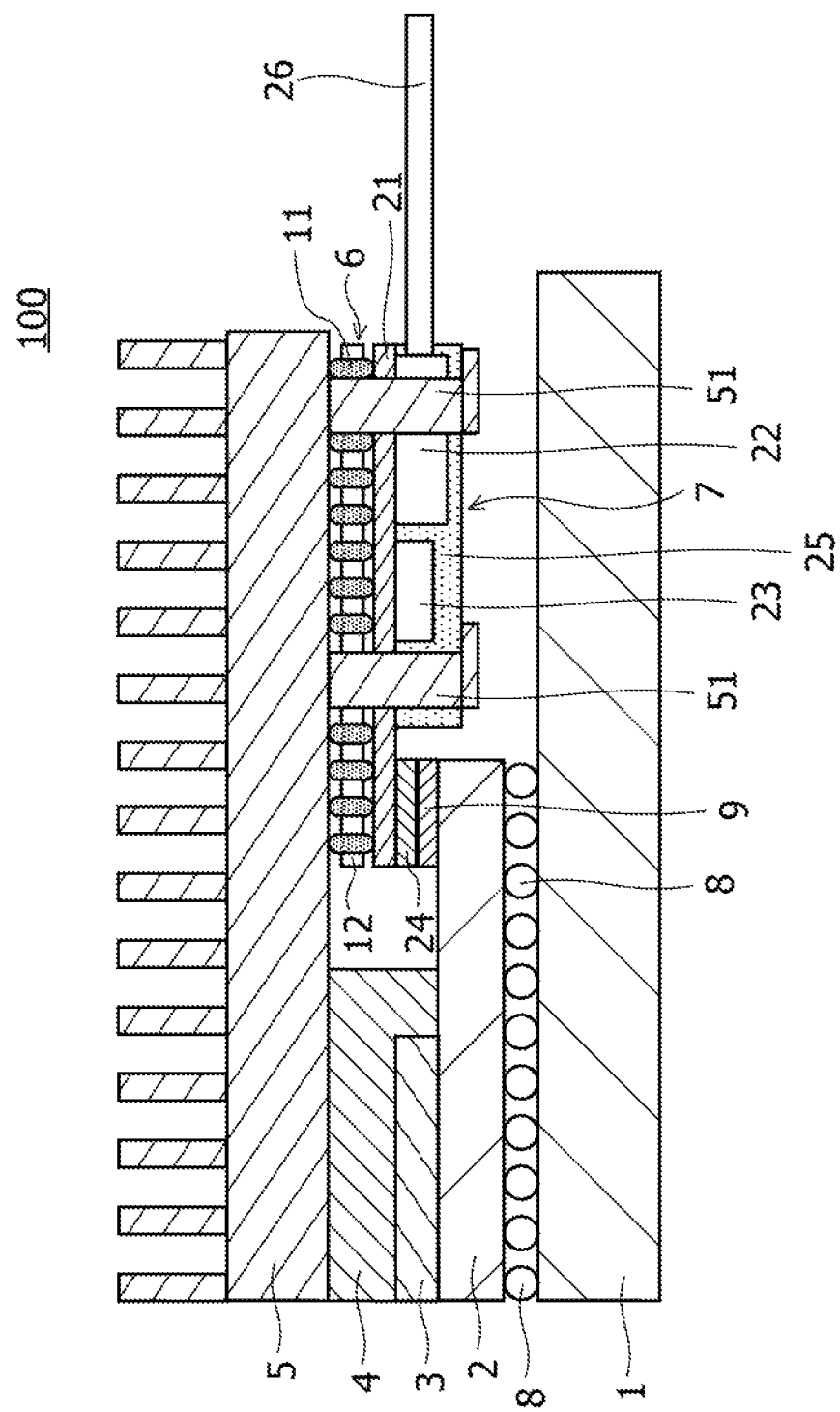
FIG. 1 is a sectional view illustrating a main board.

An exemplary embodiment will be described below with reference to FIGS. 1 to 10. FIG. 1 is a sectional view of a semiconductor device 100. The semiconductor device 100 includes a package substrate 2, a semiconductor chip 3, a lead 4, a heat sink 5, a heat transfer interposer 6, and an optical module 7.

A main board 1 is formed by, for example, plural resin layers. The semiconductor device 100 is mounted on the main board 1. The package substrate 2 of the semiconductor device 100 is mounted on the main board 1 via BGA balls 8. The package substrate 2 is formed using a material including, for example, a resin (e.g., epoxy resin, polyimide resin, or phenol resin), or a ceramic (e.g., alumina or glass ceramic). The BGA balls 8 are solder balls.

The semiconductor chip 3 and the lead 4 are mounted on the package substrate 2. The semiconductor chip 3 is a processor, such as, for example, a large scale integration (LSI) processor. The semiconductor chip 3 is flip-chip bonded to the package substrate 2. That is, in a state in which the surface of the semiconductor chip 3, which is formed with a circuit (hereinafter, referred to as a circuit surface), faces the package substrate 2, an electrode placed on the circuit surface of the semiconductor chip 3 and an electrode placed on the package substrate 2 are bonded to each other via, for example, a solder ball.

The lead 4 is formed using a metal material, such as, for example, copper (Cu) or alumina (Al). The lead 4 covers the semiconductor chip 3. The heat sink 5 is mounted on the semiconductor chip 3 via the lead 4. A thermal interface material (TIM) is formed on a surface of the semiconductor chip 3, which is opposite the circuit surface. The semiconductor chip 3 and the lead 4 are bonded to each other via the TIM. The lead 4 is formed using a metal material, such as, for example, copper or aluminum. The lead 4 protects the semiconductor chip 3, and transfers heat generated during the operation of the semiconductor chip 3, to the heat sink 5.

The heat sink 5 is formed using a metal material, such as, for example, copper or aluminum. The heat sink 5 outwardly dissipates heat transferred through the lead 4. The lead 4 and the heat sink 5 may be integrally formed with each other. The optical module 7 has the heat transfer interposer 6. The heat transfer interposer 6 and the optical module 7 are attached to the heat sink 5. Accordingly, a cooling mechanism for cooling the optical module 7 is not separately installed on the semiconductor device 100, and an independent cooling mechanism for cooling the optical module 7 is unnecessary.

The heat sink 5 has a support plate 51 that supports the heat transfer interposer 6 and the optical module 7. The support plate 51 is fixed to the heat sink 5 using, for example, a screw. The heat transfer interposer 6 and the optical module 7 are attached to the heat sink 5 by the support plate 51. Because the heat transfer interposer 6 and the optical module 7 are not fixed to the heat sink 5, the heat transfer interposer 6 and the optical module 7 are removable from the heat sink 5. The heat transfer interposer 6 and the optical module 7 may be removed from the heat sink 5 by removing the support plate 51 via unscrewing. Accordingly, for example, when a failure occurs in the optical module 7, the repair and replacement of the optical module 7 are enabled by removing the heat transfer interposer 6 and the optical module 7 from the heat sink 5.

The heat sink 5 and the optical module 7 are connected to each other via the heat transfer interposer 6. The heat transfer interposer 6 has plural pogo pins (spring pins) 11, which come into contact with the heat sink 5 and the optical module 7, and a holding member (interposer base material) 12 for holding the pogo pins 11. The pogo pins 11 are formed of a material having a heat transfer property (e.g., a metal or ceramic). The pogo pins 11 are an example of a contact member.

The optical module 7 includes a substrate 21, an optical transceiver 22, a driver IC 23, and a connector 24. The optical transceiver 22, the driver IC 23, and the connector 24 are mounted on the substrate 21. The optical transceiver 22 and the driver IC 23 are covered with a resin 25. The substrate 21 is a substrate having a heat conduction property. The substrate 21 may be a heat-conductive resin substrate, ceramic substrate, or metal core substrate in which a metal plate is formed in a resin.

The optical transceiver 22, the driver IC 23, and the connector 24 are electrically connected to one another via an inner wire of the substrate 21. The optical transceiver 22 is connected to an optical fiber 26. The optical transceiver 22 has a light-emitting element that converts an electrical signal, which is input through the connector 24, into light, and a light-receiving element that converts light, which is input through the optical fiber 26, into an electrical signal. The light-emitting element may be, for example, a vertical cavity surface emitting laser (VCSEL), but may be any other laser. The light-emitting element is, for example, a photodiode. The driver IC 23 is a circuit element, and drives the optical transceiver 22.

A connector 9 is mounted on the package substrate 2. The package substrate 2 and the optical module 7 are connected to each other by fitting the connector 9 and the connector 24 to each other in a direction perpendicular to the package substrate 2. When the package substrate 2 and the optical module 7 are connected to each other, electrical signals are transmitted and received between the semiconductor chip 3 and the optical module 7 through the package substrate 2.

Heat is generated from the semiconductor chip 3 when the semiconductor chip 3 is driven. The heat is transferred from the semiconductor chip 3 to the heat sink 5 through the lead 4, and is then dissipated from the heat sink 5 to the air. Heat is generated from the optical module 7 when the optical transceiver 22 and the driver IC 23 are driven. The heat of the optical transceiver 22 and the driver IC 23 is transferred to the pogo pins 11 through the substrate 21. The heat is transferred from the optical module 7 to the heat sink 5 through the pogo pins 11, and is then dissipated from the heat sink 5.

Figure 2:
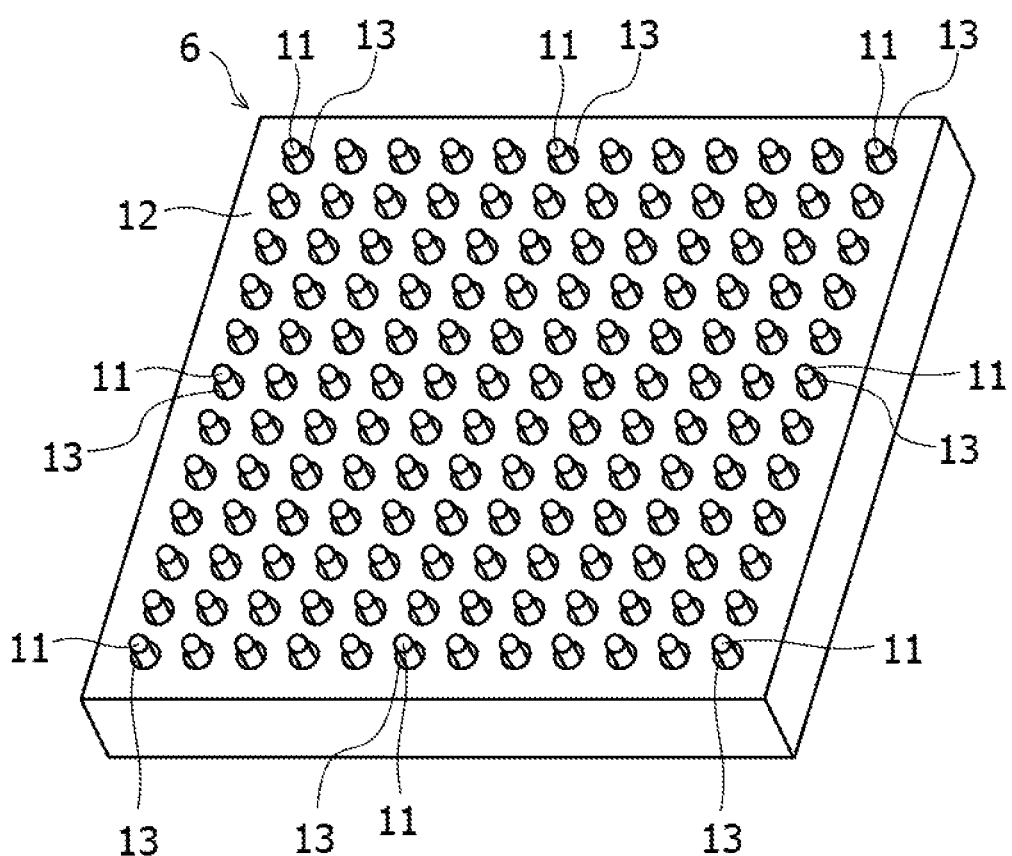
FIG. 2 is a perspective view illustrating a heat transfer interposer.
Figure 3:
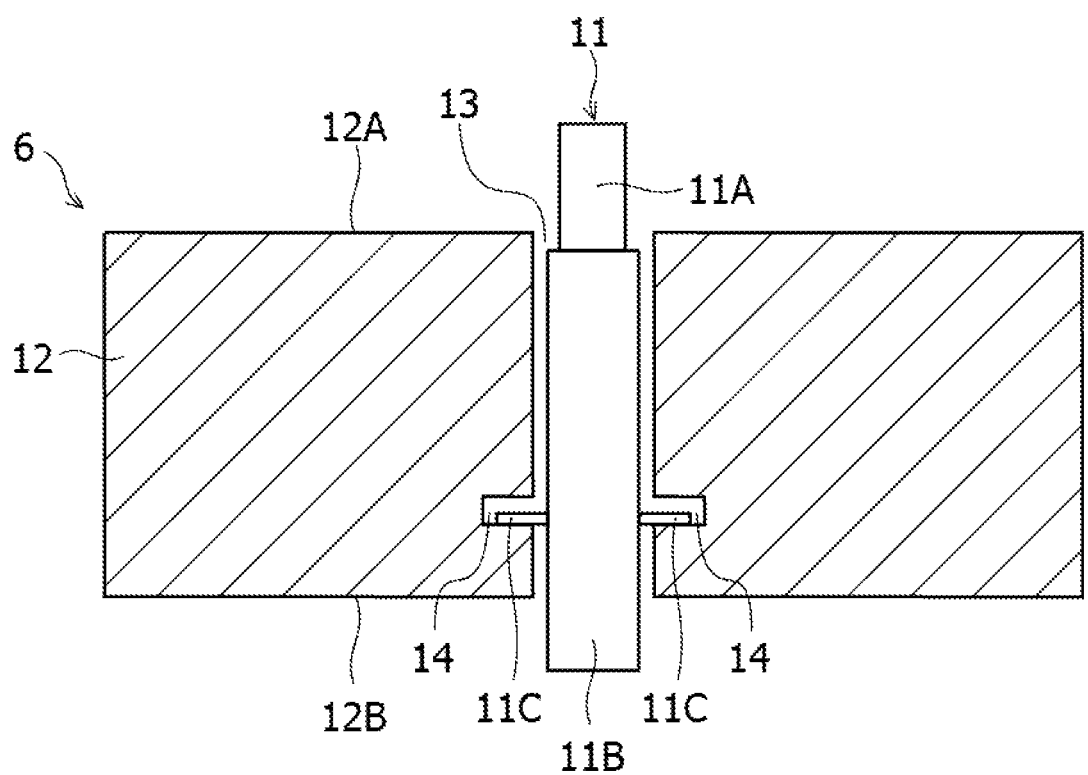
FIG. 3 is a partial sectional view illustrating the heat transfer interposer.
Figure 4:
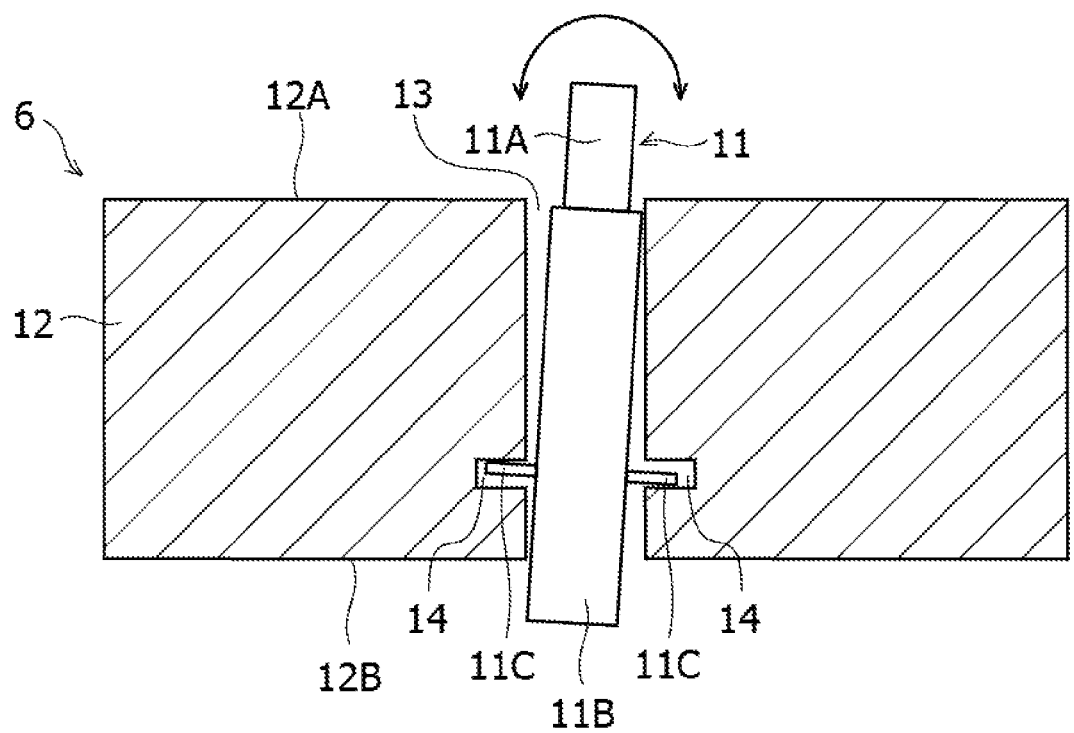
FIG. 4 is a partial sectional view illustrating the heat transfer interposer.

FIG. 2 is a perspective view of the heat transfer interposer 6. FIGS. 3 and 4 are partial sectional views of the heat transfer interposer 6. The holding member 12 has plural through-holes 13 formed therein. The pogo pins 11 are inserted into the through-holes 13 in the holding member 12. Each of the pogo pins 11 has a cylindrical first contact portion 11A and a cylindrical second contact portion 11B. The first contact portion 11A of the pogo pin 11 protrudes from a first surface 12A of the holding member 12, and the second contact portion 11B of the pogo pin 11 protrudes from a second surface 12B of the holding member 12. The first surface 12A of the holding member 12 opposites the heat sink 5. The second surface 12B of the holding member 12 faces the optical module 7. Each pogo pin 11 is expanded/contracted in the longitudinal direction thereof. Hereinafter, the longitudinal direction of the pogo pin 11 is referred to as a first direction.

A protrusion 11C formed on a side surface of the second contact portion 11B is inserted into a groove 14 formed in an inner wall of the through-hole 13 in the holding member 12 such that the holding member 12 holds the pogo pin 11. The side surface of the second contact portion 11B does not come into contact with the inner wall of the through-hole 13 in the holding member 12, and a margin is formed between the second contact portion 11B and the holding member 12. That is, a gap is formed between the pogo pin 11 and the holding member 12.

When a force (load) is applied to the pogo pin 11 from a direction perpendicular to the longitudinal direction of the pogo pin 11, the pogo pin 11 may be moved in the direction perpendicular to the longitudinal direction of the pogo pin 11 inside the through-hole 13 in the holding member 12. Hereinafter, the direction perpendicular to the longitudinal direction of the pogo pin 11 is referred to as a second direction. The moving distance of the pogo pin 11 is, for example, ±0.5 mm from the center axis of the through-hole 13 in the holding member 12. In addition, when a force is applied to the pogo pin 11 from the second direction, as illustrated in FIG. 4, the pogo pin 11 may be tilted within the through-hole 13 in the holding member 12. As such, the pogo pin 11 has a high degree of freedom of movement within the through-hole 13 in the holding member 12.

Figure 5:
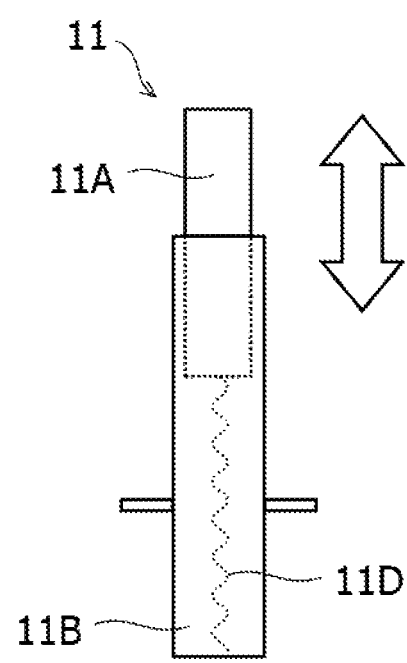
FIG. 5 is a schematic view of a pogo pin.

FIG. 5 is a schematic view of the pogo pin 11. The first contact portion 11A is introduced into the second contact portion 11B. A spring 11D is provided inside the second contact portion 11B. The spring 11D is attached to the bottom portion of the first contact portion 11A. When a force is applied to the pogo pin 11 from the first direction and the spring 11D is contracted, the first contact portion 11A is more deeply introduced into the second contact portion 11B, and the pogo pin 11 is contracted. When the force applied to the pogo pin 11 is removed and the spring 11D is expanded, the pogo pin 11 is expanded. The expansion and contraction (stroke) of the pogo pin 11 is, for example, about 0.75 mm.

The positional deviation of the connector 9 and the connector 24 will be described below. After the optical module 7 is attached to the heat sink 5 and the alignment of the connector 9 and the connector 24 is performed, the heat sink 5 is attached to the lead 4. The positional deviation of the connector 9 and the connector 24 may occur due to, for example, a dimensional variation of the heat sink 5, or a dimensional variation caused when the heat sink 5 is attached to the lead 4. In addition, the positional deviation of the connector 9 and the connector 24 may occur due to a dimensional variation caused when the connector 9 is mounted on the package substrate 2, or a dimensional variation caused when the connector 24 is mounted on the substrate 21. When the positional deviation of the connector 9 and the connector 24 occurs, the fitting of the connector 9 and the connector 24 may be insufficient.

In the semiconductor device 100, because the optical module 7 is not fixed to the heat sink 5, the optical module 7 has a degree of freedom of movement (motion) in the second direction. Therefore, the optical module 7 may be moved in the second direction after the optical module 7 is attached to the heat sink 5. Accordingly, the positional deviation of the connector 9 and the connector 24 may be absorbed by moving the optical module 7 in the second direction after the optical module 7 is attached to the heat sink 5. With the semiconductor device 100, even when the positional deviation of the connector 9 and the connector 24 occurs, highly reliable fitting and contact may be realized when the connector 9 and the connector 24 are fitted to each other.

When the optical module 7 is moved in the second direction, the pogo pin 11 is moved in the second direction within the through-hole 13 in the holding member 12. That is, a force is applied from the optical module 7 to the plural pogo pins 11 when the optical module 7 is moved in the second direction. The pogo pins 11 come into contact with the heat sink 5 and the optical module 7 in a state in which they are moved in the second direction by receiving the force from the optical module 7. Accordingly, even if the optical module 7 is moved in the second direction, the contact between the optical module 7 and the pogo pins 11 is maintained, and in addition, the contact between the heat sink 5 and the pogo pins 11 is maintained. As such, in a state in which the thermal contact of the heat sink 5 and the optical module 7 is maintained via the heat transfer interposer 6, the optical module 7 may be moved in the horizontal plane.

Figure 6:
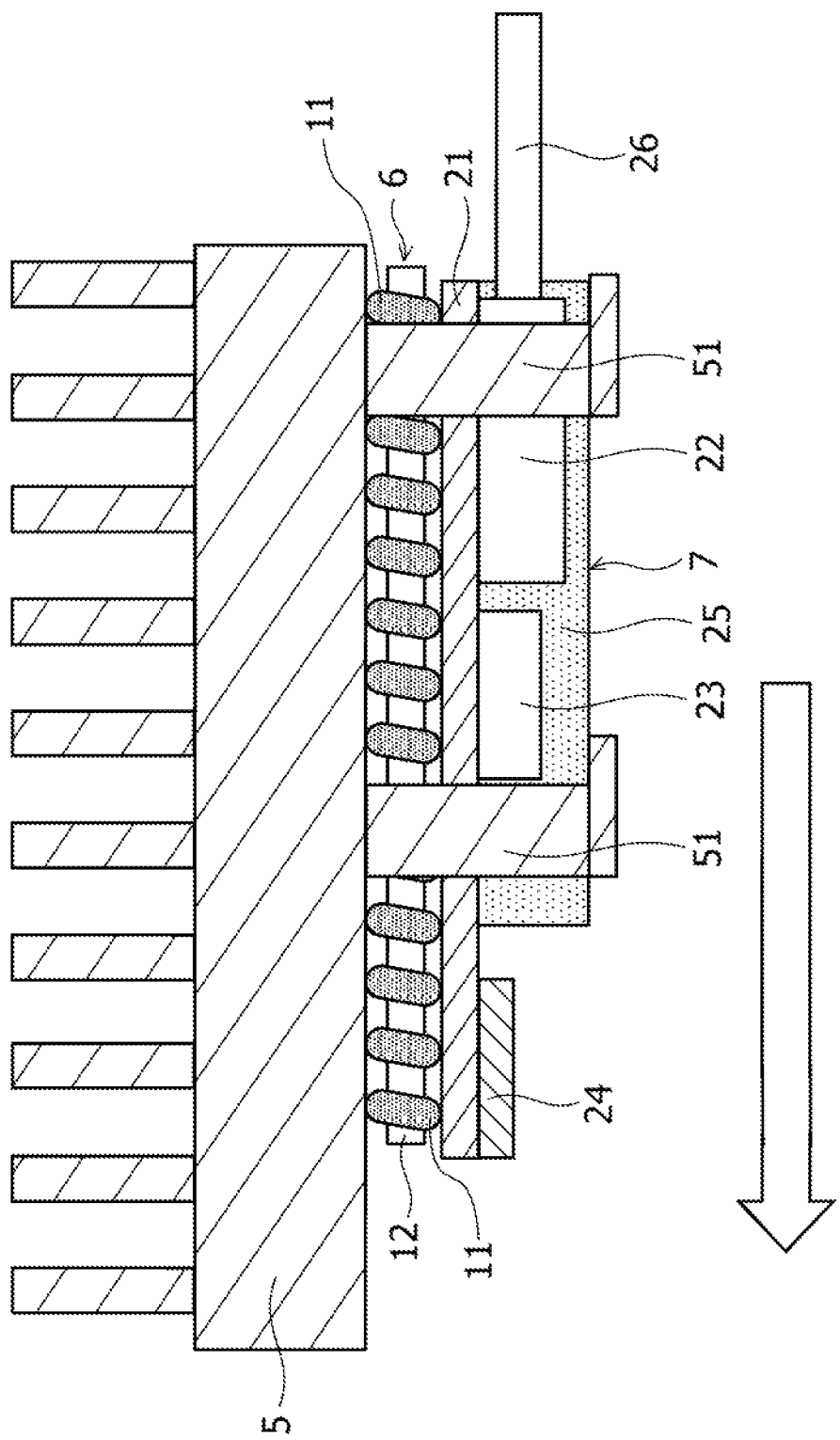
FIG. 6 is a sectional view illustrating a heat sink, an interposer, and an optical module.

When the optical module 7 is moved in the second direction, the pogo pin 11 is tilted inside the through-hole 13 in the holding member 12. That is, when the optical module 7 is moved in the second direction, a force is applied from the optical module 7 to the plural pogo pins 11. FIG. 6 is a sectional view of the heat sink 5, the heat transfer interposer 6, and the optical module 7. As illustrated in FIG. 6, the pogo pins 11 come into contact with the heat sink 5 and the optical module 7 in a state in which they are tilted by receiving the force from the optical module 7. In addition, the pogo pins 11 are moved in the second direction upon receiving force from the optical module 7, and come into contact with the heat sink 5 and the optical module 7 in the tilted state thereof. Accordingly, even if the optical module 7 is moved in the second direction, the contact between the optical module 7 and the pogo pins 11 is maintained, and in addition, the contact between the heat sink 5 and the pogo pins 11 is maintained. As such, in a state in which the thermal contact between the heat sink 5 and the optical module 7 is maintained via the heat transfer interposer 6, the optical module 7 may be moved in the horizontal plane.

When the package substrate 2 is mounted on the main board 1 using the BGA balls 8, bending may occur in the package substrate 2 by heat during the mounting of the package substrate 2. The bending of the package substrate 2 is increased from the central portion toward the outer circumferential portion of the package substrate 2. The connector 9 is mounted on the outer circumferential portion of the package substrate 2. Accordingly, when the connector 9 is tilted by the bending of the package substrate 2, the positional deviation of the connector 9 and the connector 24 may occur. When the position deviation of the connector 9 and the connector 24 occurs, the fitting of the connector 9 and the connector 24 may be insufficient.

Because the optical module 7 is not fixed to the heat sink 5, the optical module 7 has a degree of freedom of tilting (pivoting). Therefore, the optical module 7 may be tilted after the optical module 7 is attached to the heat sink 5. Accordingly, the positional deviation of the connector 9 and the connector 24 may be absorbed by tilting the optical module 7 after the optical module 7 is attached to the heat sink 5. With the semiconductor device 100, even when the positional deviation of the connector 9 and the connector 24 occurs, highly reliable fitting and contact may be realized when the connector 9 and the connector 24 are fitted to each other.

Figure 7:
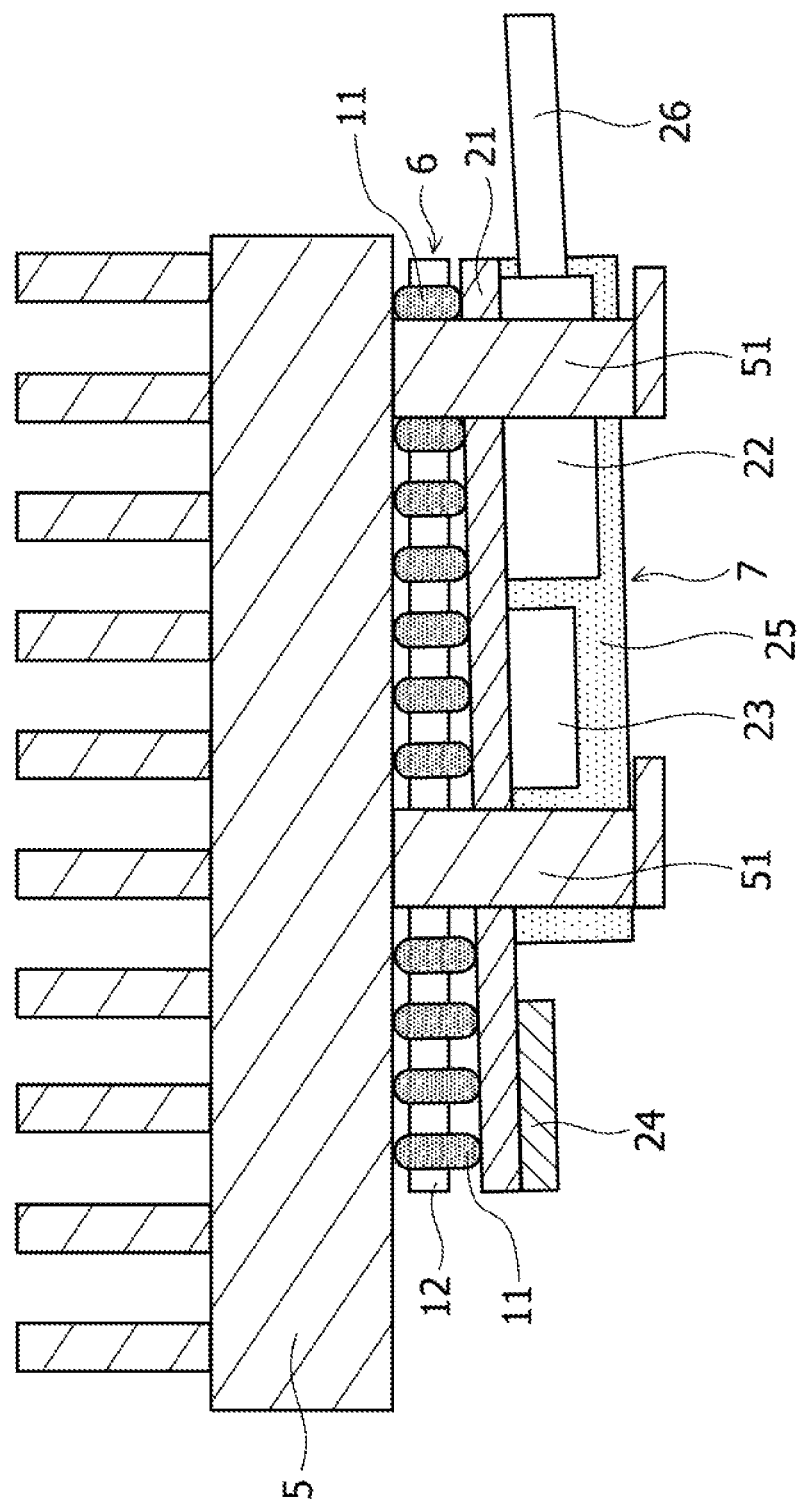
FIG. 7 is a sectional view illustrating a heat sink, an interposer, and an optical module.

FIG. 7 is a sectional view illustrating the heat sink 5, the heat transfer interposer 6, and the optical module 7. As illustrated in FIG. 7, when the optical module 7 is tilted relative to the heat sink 5, some of the pogo pins 11 are contracted such that the contact between the optical module 7 and the pogo pins 11 is maintained, and in addition, the contact between the heat sink 5 and the pogo pins 11 is maintained. In addition, when the optical module 7 is tilted relative to the heat sink 5, at least one of the pogo pins 11 is contracted such that the contact between the optical module 7 and the pogo pins 11 is maintained, and in addition, the contact between the heat sink 5 and the pogo pins 11 is maintained. As such, the optical module 7 may be tilted in a state in which the thermal contact between the heat sink 5 and the optical module 7 is maintained via the heat transfer interposer 6.

When the optical module 7 is tilted, a force is applied from the optical module 7 to at least one of the pogo pins 11. At least one of the pogo pins 11 comes into contact with the heat sink 5 and the optical module 7 in a state in which the corresponding pogo pin is contracted by receiving the force from the optical module 7. The pogo pins 11 may be configured so as to be contracted even when a low force (load) is applied to the pogo pins 11. Because at least one of the pogo pins 11 is contracted even when a low load is applied to at least one of the pogo pins 11, the contact between the optical module 7 and the pogo pins 11 is maintained, and in addition, the contact between the heat sink 5 and the pogo pins 11 is maintained. In this way, the optical module 7 may be tilted in a state in which the thermal contact between the heat sink 5 and the optical module 7 is maintained via the heat transfer interposer 6.

When the optical module 7 is moved in the second direction, and in addition, is tilted, the plural pogo pins 11 may come into contact with the heat sink 5 and the optical module 7 in the state where the plural pogo pins are tilted and at least one of the pogo pins 11 is contracted. When the optical module 7 is moved in the second direction, and in addition, is tilted, the pogo pins 11 may come into contact with the heat sink 5 and the optical module 7 in the state where the pogo pins 11 are moved in the second direction, and in addition, at least one of the pogo pins 11 is contracted. When the optical module 7 is moved in the second direction, and in addition, is tilted, the pogo pins 11 may come into contact with the heat sink 5 and the optical module 7 in the state where the pogo pins 11 are moved in the second direction and are also tilted, and in addition, at least one of the pogo pins 11 is contracted. Even in any case described above, the contact between the optical module 7 and the pogo pins 11 is maintained, and in addition, the contact between the heat sink 5 and the pogo pins 11 is maintained. As such, the optical module 7 may be moved in the horizontal plane, and in addition, the optical module 7 may be tilted in a state in which the thermal contact between the heat sink 5 and the optical module 7 is maintained via the heat transfer interposer 6.

In the semiconductor device 100 illustrated in FIG. 1, the substrate 21 of the optical module 7 and the pogo pins 11 of the heat transfer interposer 6 come into contact with each other. Without being limited to the semiconductor device 100 illustrated in FIG. 1, the resin 25 of the optical module 7 and the pogo pins 11 of the heat transfer interposer 6 may come into contact with each other as illustrated in FIG. 8.

Figure 8:
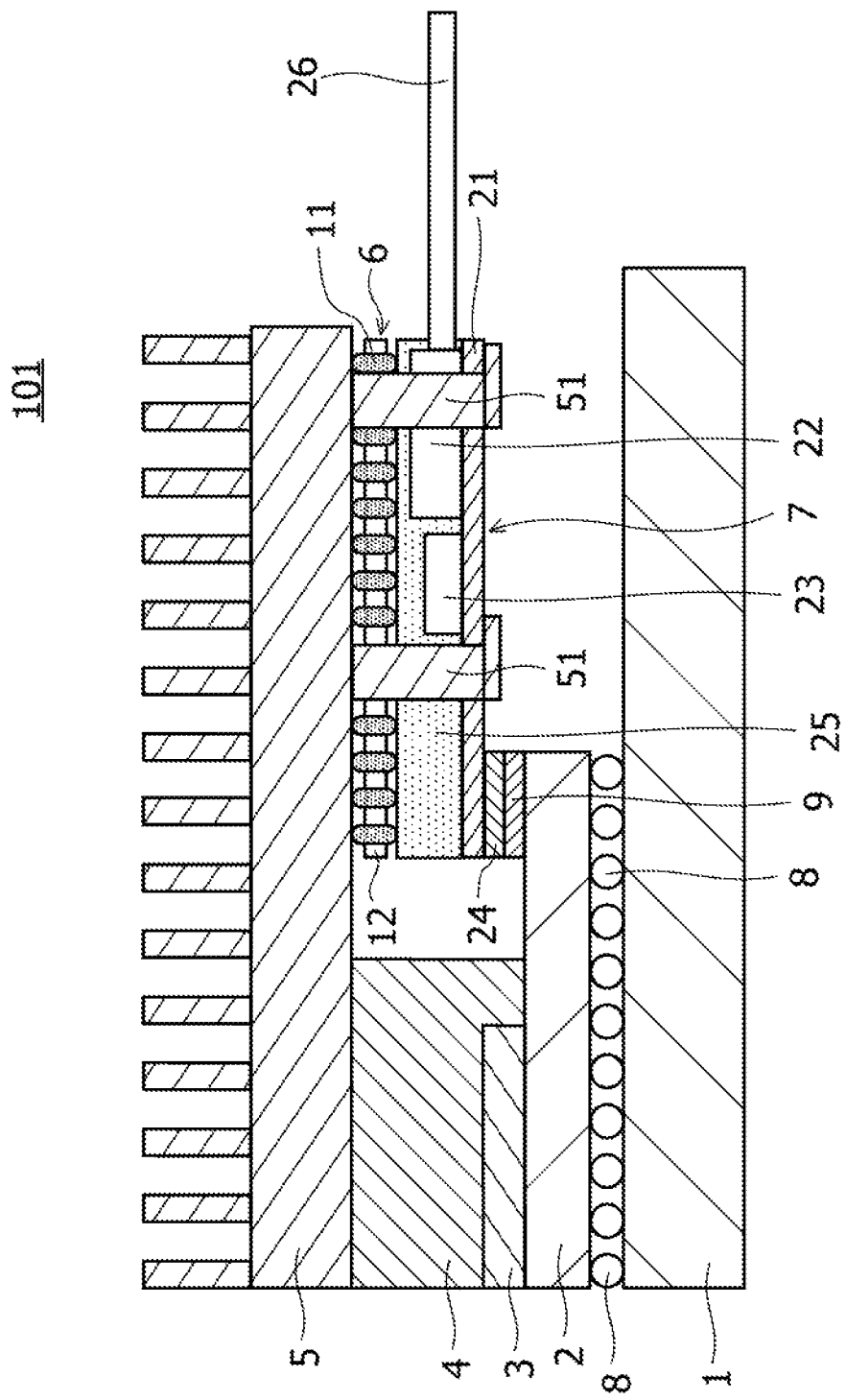
FIG. 8 is a sectional view illustrating a main board.

FIG. 8 is a sectional view of a semiconductor device 101. By using a heat conductive resin 25, heat of the optical transceiver 22 and the driver IC 23 is transferred to the pogo pins 11 through the resin 25. The heat is transferred from the optical module 7 to the heat sink 5 through the pogo pins 11, and is then dissipated from the heat sink 5.

The semiconductor device 100 illustrated in FIG. 1 includes the connectors 9 and 24, the substrate 21, and the heat transfer interposer 6, which are arranged between the package substrate 2 and the heat sink 5. The semiconductor device 101 illustrated in FIG. 8 includes the connectors 9 and 24, the substrate 21, the resin 25, and the heat transfer interposer 6, which are arranged between the package substrate 2 and the heat sink 5. Accordingly, in the semiconductor device 100 illustrated in FIG. 1, the height from the main board 1 to the heat sink 5 may be reduced as compared to that in the semiconductor device 101 illustrated in FIG. 8.

The semiconductor devices illustrated in FIGS. 1 and 8 enable the transfer of heat from the optical module 7 to the heat sink 5 through the pogo pins 11. Without being limited to the semiconductor devices illustrated in FIGS. 1 and 8, heat may be transferred from the optical module 7 to the heat sink 5 through plural land grid array (LGA) contacts 41, which are used in a land grid array interposer, as illustrated in FIG. 9.

Figure 9:
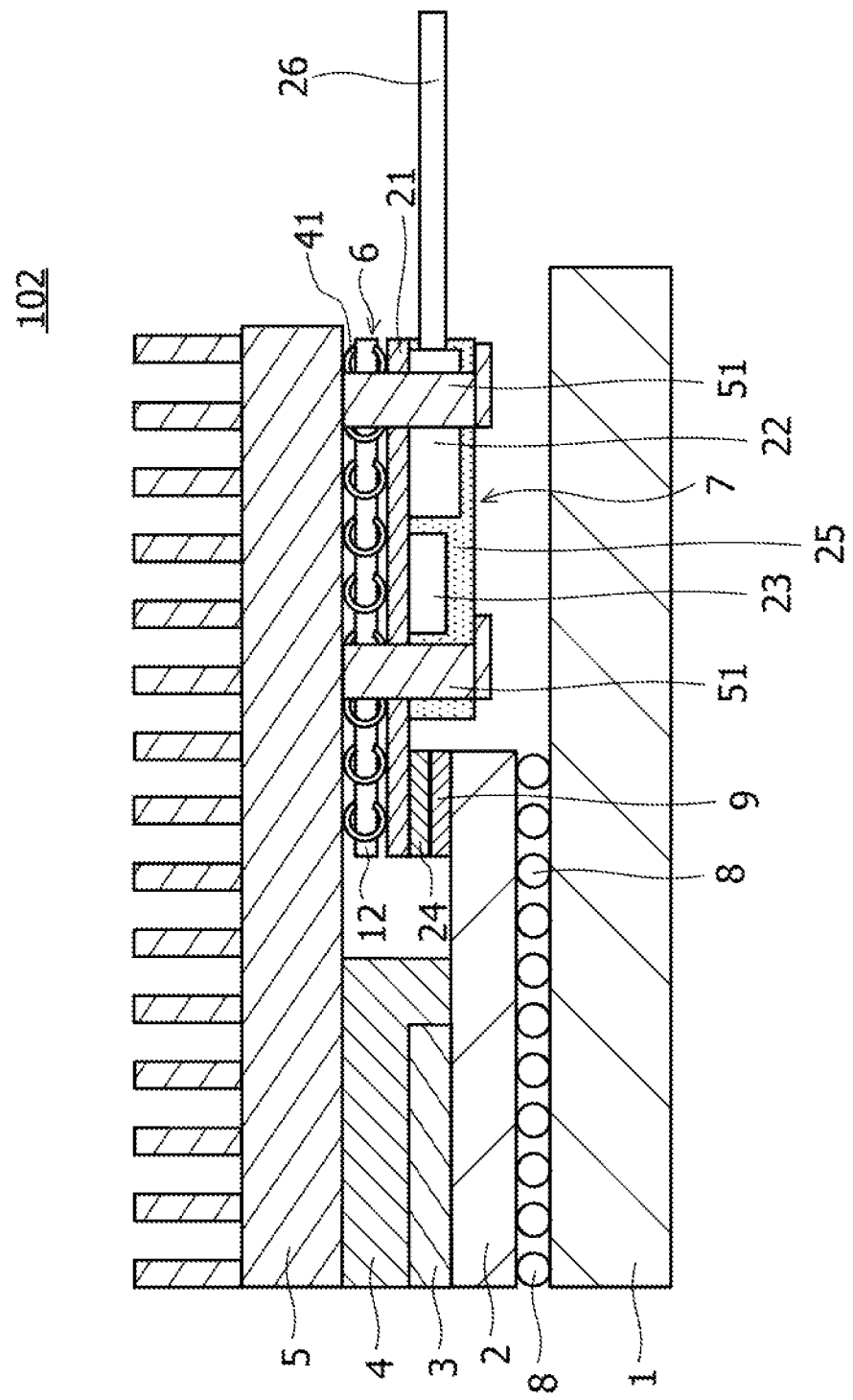
FIG. 9 is a sectional view illustrating a main board.

FIG. 9 is a sectional view of a semiconductor device 102. The LGA contacts 41 are formed of a heat-conductive material, such as, for example, a metal. The LGA contacts 41 are an example of a contact member.

In the semiconductor devices 100, 101, and 102 illustrated in FIGS. 1, 8, and 9, a gap is present between the heat sink 5 and the holding member 12 of the heat transfer interposer 6, and in addition, a gap is present between the heat transfer interposer 6 and the substrate 21 of the optical module 7. A thermal conductive member, such as, for example, a thermal compound or thermal Greece may be installed either in the gap between the heat sink 5 and the holding member 12 of the heat transfer interposer 6 or in the gap between the heat transfer interposer 6 and the substrate 21 of the optical module 7. By using a heat-conductive holding member 12, heat is transferred from the optical module 7 to the heat sink 5 through the holding member 12 and the thermal conductive member, and is then dissipated from the heat sink 5.

The semiconductor devices illustrated in FIGS. 1, 8, and 9 adopt a stack connector method of fitting the connector 9 and the connector 24 to each other in a direction perpendicular to the package substrate 2. The package substrate 2 and the optical module 7 may be connected to each other by a card edge connector method, without being limited to structural examples illustrated in FIGS. 1, 8 and 9.

Figure 10:
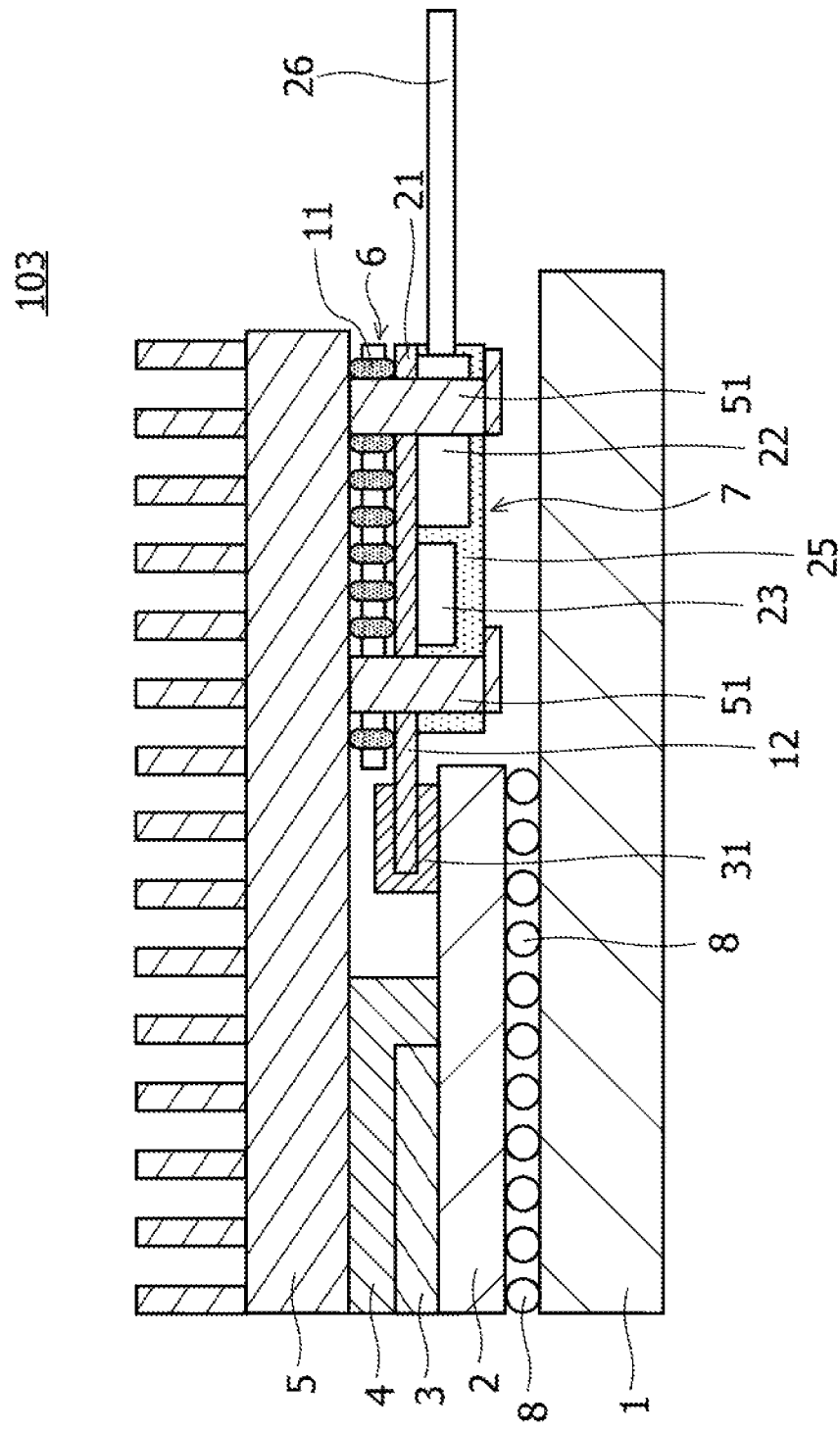
FIG. 10 is a sectional view illustrating a main board.

FIG. 10 is a sectional view of a semiconductor device 103 in a case where the package substrate 2 and the optical module 7 are connected to each other using a card edge connector method. As illustrated in FIG. 10, a connector 31 may be mounted on the package substrate 2, and the substrate 21 of the optical module 7 and the connector 31 may be fitted to each other in a direction parallel to the package substrate 2.

Figure 11:
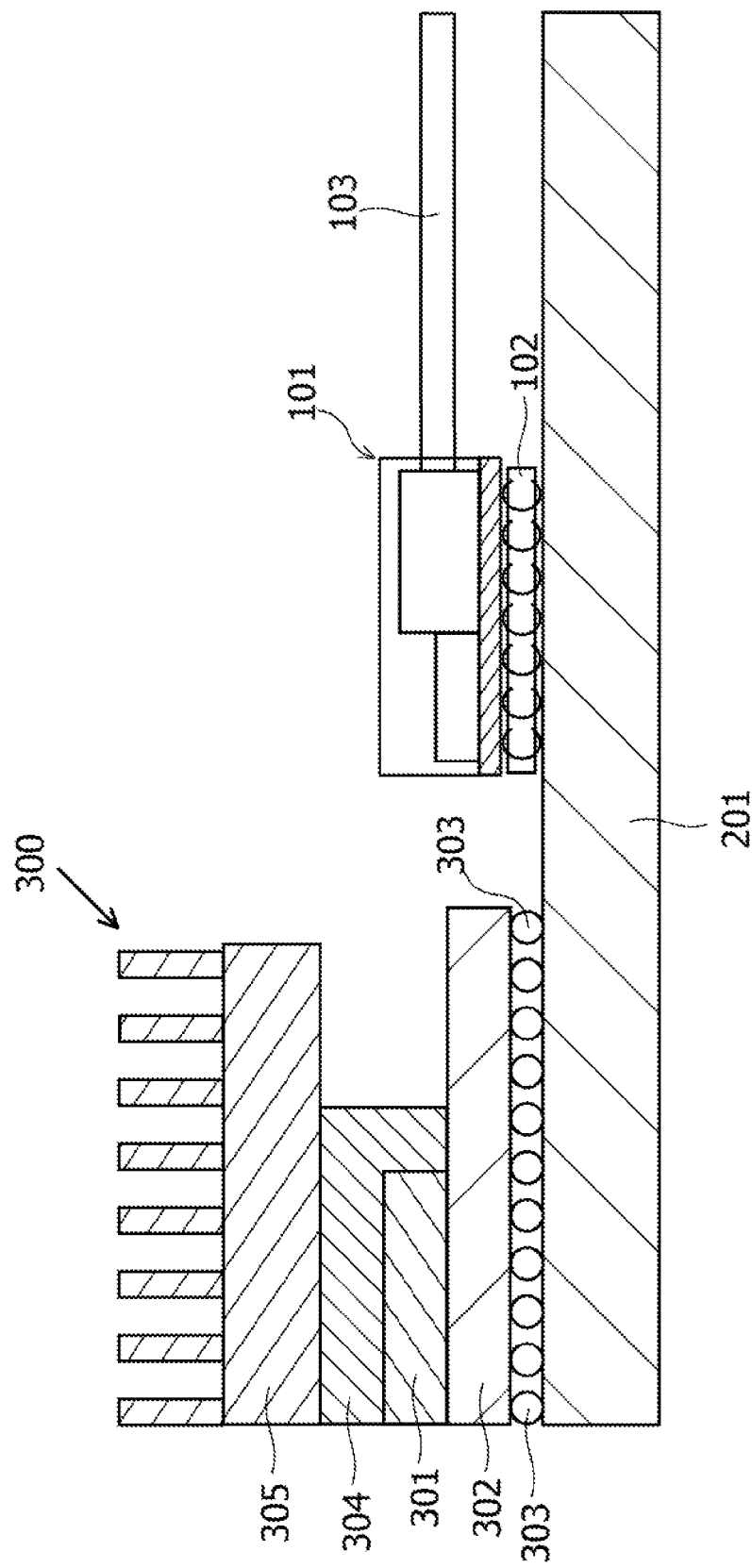
FIG. 11 is a sectional view illustrating a main board related to a comparative example.

In the main board 201 illustrated in FIG. 11, a transmission path from the semiconductor chip 301 to the optical module 101 follows the sequence of the semiconductor chip 301, the package substrate 302, the BGA balls 303, the main board 201, the interposer 102, and the optical module 101. In the main board 201 illustrated in FIG. 12, a transmission path from the semiconductor chip 301 to the optical module 101 follows the sequence of the semiconductor chip 301, the package substrate 302, the interposer 102, and the optical module 101. As illustrated in FIG. 1 and FIGS. 8 to 10, a transmission path from the semiconductor chip 3 to the optical module 7 follows the sequence of the semiconductor chip 3, the package substrate 2, and the optical module 7. Accordingly, the semiconductor device 103 may reduce an electrical length (electrical distance) of the transmission path from the semiconductor chip 3 to the optical module 7 as compared to the semiconductor devices illustrated in FIGS. 11 and 12.

In the semiconductor device illustrated in FIG. 12, the optical module 101 is mounted on the package substrate 302. In the semiconductor devices illustrated in FIGS. 1, 8 and 9, the connection of the package substrate 2 and the optical module 7 is performed by fitting the connector 9 and the connector 24 to each other.

In addition, in the semiconductor device 103 illustrated in FIG. 10, the connection of the package substrate 2 and the optical module 7 is performed by fitting the substrate 21 of the optical module 7 and the connector 31 to each other. In the semiconductor device 103, because the optical module 7 is attached to the heat sink 5, stress generated on the BGA balls 8, which connect the main board 1 and the package substrate 2 to each other, may be suppressed. Accordingly, the releasing or damage of the BGA balls 8, which connect the main board 1 and the package substrate 2 to each other, may be suppressed.

In the example illustrated in FIG. 11, the optical module 101 is mounted on the main board 201.

In the example illustrated in FIG. 12, the optical module 101 is mounted on the package substrate 302.

In the example illustrated in FIGS. 13 and 14, the support member 405 for supporting the optical module 101 is placed on the main board 201.

In the semiconductor devices illustrated in FIGS. 1, 8, 9 and 10, the optical module 7 is not mounted on the main board 1 because the optical module 7 is attached to the heat sink 5. Accordingly, a mounting space above the main board 1 and below the optical module 7 is empty. Thus, with the main board 1, the mounting space above the main board 1 and below the optical module 7 may be used. For example, an electronic element may be mounted on the main board 1 below the optical module 7.

In the semiconductor devices 101 to 103, a cooling mechanism for cooling the optical module 7 is not separately installed because the optical module 7 is attached to the heat sink 5. With the semiconductor devices 101 to 103, an independent cooling mechanism for cooling the optical module 7 may be unnecessary, which enables a reduction in the number of elements. In addition, with the mounting of the semiconductor devices 101 to 103, because the optical module 7 is attached to the heat sink 5, the heat sink 5 and the optical module 7 for the semiconductor device 103 may be performed through the same process. As a result, the number of assembly processes of the semiconductor devices 101 to 103 may be reduced.

Plural heat transfer interposers 6 and plural optical modules 7 may be attached to the heat sink 5. Plural connectors 9 may be mounted on the package substrate 2. When the heat sink 5 is attached to the lead 4, fitting of connectors 24 of the optical modules 7 and the connectors 9 may be performed at the same time. According to the present embodiment, with respect to each of the heat transfer interposers 6 and the optical modules 7, each optical module 7 may be moved in the horizontal plane in a state in which the thermal contact of the heat sink 5 and the optical module 7 is maintained via each heat transfer interposer 6. According to the present embodiment, with respect to each of the heat transfer interposers 6 and the optical modules 7, each optical module 7 may be tilted in a state in which the thermal contact of the heat sink 5 and the optical module 7 is maintained via each heat transfer interposer 6.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a processor chip formed on a first substrate and having a heat sink mounted thereon; and an optical device formed on a surface of a second substrate different from the first substrate and having a heat transfer interposer formed on an opposite surface of the second substrate which is opposite to the surface of the second substrate where the optical device is formed, the heat sink of the processor chip and the optical device are coupled to each other via the heat transfer interposer formed on the opposite surface of the second substrate.

2. The semiconductor device according to claim 1, wherein the heat transfer interposer includes: a plurality of contact members that come into contact with the heat sink and the optical module; and a holding member that holds the contact members.

3. The semiconductor device according to claim 2, wherein a force is applied from the optical device to the contact members when the optical device is moved in a direction perpendicular to a longitudinal direction of the contact members, and the contact members come into contact with the heat sink and the optical device in a state where the contact members are moved in the direction perpendicular to the longitudinal direction of the contact members by receiving the force from the optical device.

4. The semiconductor device according to claim 2, wherein a force is applied from the optical device to the contact members when the optical device is moved in a direction perpendicular to a longitudinal direction of the contact members, and the contact members come into contact with the heat sink and the optical device in a state where the contact members are tilted by receiving the force from the optical device.

5. The semiconductor device according to claim 2, wherein the contact members are expanded/contracted in a longitudinal direction thereof, a force is applied from the optical device to the contact members when the optical device is tilted, and at least one of the contact members comes into contact with the heat sink and the optical device in a contracted state by receiving the force from the optical device.

6. A semiconductor device comprising:
a semiconductor chip mounted on a first substrate;
a lead that covers the semiconductor chip;
a heat sink installed on the lead; and
an optical device formed on a surface of a second substrate different from the first substrate and coupled to the heat sink via a heat transfer interposer formed on an opposite surface of the second substrate which is opposite to the surface of the second substrate where the optical module is formed.

7. The semiconductor device according to claim 1, wherein the surface of the second substrate where the optical device is formed is coupled to the surface of the first substrate where the processor chip is mounted through a connector such that signals are communicated between the processor chip and the optical device through the connector.

8. The semiconductor device according to claim 6, wherein the surface of the second substrate where the optical device is formed is coupled to the surface of the first substrate where the semiconductor chip is mounted through a connector such that signals are communicated between the semiconductor chip and the optical device through the connector.

* * * * *